US010131993B2

(12) United States Patent
Varadan et al.

(10) Patent No.: US 10,131,993 B2
(45) Date of Patent: Nov. 20, 2018

(54) LARGE SCALE MANUFACTURING OF HYBRID NANOSTRUCTURED TEXTILE SENSORS

(71) Applicant: NANOWEAR INC., Brooklyn, NY (US)

(72) Inventors: Vijay K. Varadan, State College, PA (US); Pratyush Rai, State College, PA (US); Se Chang Oh, State College, PA (US)

(73) Assignee: Nanowear, Inc., Brooklyn, NY (US)

( * ) Notice: Subject to any disclaimer, the term of this patent is extended or adjusted under 35 U.S.C. 154(b) by 28 days.

(21) Appl. No.: 15/425,302

(22) Filed: Feb. 6, 2017

(65) Prior Publication Data

US 2017/0226643 A1   Aug. 10, 2017
US 2018/0080126 A9   Mar. 22, 2018

Related U.S. Application Data

(63) Continuation-in-part of application No. 14/995,334, filed on Jan. 14, 2016.
(Continued)

(51) Int. Cl.
*C23C 18/31* (2006.01)
*C23C 18/16* (2006.01)
(Continued)

(52) U.S. Cl.
CPC ...... *C23C 18/1692* (2013.01); *C23C 18/1635* (2013.01); *C23C 18/31* (2013.01);
(Continued)

(58) Field of Classification Search
CPC ............ C23C 18/1635; C23C 18/1641; C23C 18/1692; C23C 18/2086; C23C 18/31; H05K 3/12; H05K 3/4661
(Continued)

(56) References Cited

U.S. PATENT DOCUMENTS 4,367,752 A    1/1983  Jimenez et al.
5,415,748 A *  5/1995  Emiliani ................ C25D 13/02
                                                       204/491
(Continued)

OTHER PUBLICATIONS

Lao et al. "Hierarchical Oxide Nanostructures" J. Mater. Chem., 14, 770-773. Oct. 23, 2003.
(Continued)

*Primary Examiner* — Brian K Talbot
(74) *Attorney, Agent, or Firm* — Davidson, Davidson & Kappel, LLC

(57) ABSTRACT

A process for the large-scale manufacturing vertically standing hybrid nanometer scale structures of different geometries including fractal architecture of nanostructure within a nano/micro structures made of flexible materials, on a flexible substrate including textiles is disclosed. The structures increase the surface area of the substrate. The structures maybe coated with materials that are sensitive to various physical parameters or chemicals such as but not limited to humidity, pressure, atmospheric pressure, and electromagnetic signals originating from biological or non-biological sources, volatile gases and pH. The increased surface area achieved through the disclosed process is intended to improve the sensitivity of the sensors formed by coating of the structure and substrate with a material which can be used to sense physical parameters and chemicals as listed previously. An embodiment with the structures on a textile substrate coated with a conductive, malleable and biocompatible sensing material for use as a biopotential measurement electrode is provided.

16 Claims, 15 Drawing Sheets

Related U.S. Application Data

(60) Provisional application No. 62/291,088, filed on Feb. 4, 2016, provisional application No. 62/104,686, filed on Jan. 16, 2015.

(51) Int. Cl.

| | | |
|---|---|---|
| *D06N 1/00* | (2006.01) | |
| *B82Y 40/00* | (2011.01) | |
| *C23C 18/20* | (2006.01) | |
| *H05K 3/12* | (2006.01) | |
| *B82Y 30/00* | (2011.01) | |
| *B82Y 15/00* | (2011.01) | |
| *H05K 3/46* | (2006.01) | |

(52) U.S. Cl.
CPC ............. *D06N 1/00* (2013.01); *B82Y 15/00* (2013.01); *B82Y 30/00* (2013.01); *B82Y 40/00* (2013.01); *C23C 18/1641* (2013.01); *C23C 18/2086* (2013.01); *H05K 3/12* (2013.01); *H05K 3/4661* (2013.01)

(58) Field of Classification Search
USPC ......................................................... 427/58
See application file for complete search history.

(56) References Cited

U.S. PATENT DOCUMENTS

| | | | |
|---|---|---|---|
| 5,423,956 A * | 6/1995 | White ................. | C08G 61/123 205/148 |
| 5,501,229 A | 3/1996 | Sekler et al. | |
| 5,749,365 A | 5/1998 | Magill | |
| 5,802,607 A | 9/1998 | Triplette | |
| 5,853,005 A | 12/1998 | Scanlon | |
| 6,047,203 A | 4/2000 | Sackner et al. | |
| 6,662,032 B1 | 12/2003 | Gavish et al. | |
| 6,687,523 B1 | 2/2004 | Jayaramen et al. | |
| 7,136,693 B2 | 11/2006 | Brodnick | |
| 7,319,895 B2 | 1/2008 | Klefstad-Sillonville et al. | |
| 7,354,877 B2 | 4/2008 | Rosenberger et al. | |
| 7,390,760 B1 | 7/2008 | Chen et al. | |
| 7,559,902 B2 | 7/2009 | Ting et al. | |
| 7,592,276 B2 | 9/2009 | Hill ........................ | D02G 3/441 313/51 |
| 7,857,777 B2 | 12/2010 | Larson et al. | |
| 7,862,624 B2 | 1/2011 | Tran | |
| 7,871,700 B2 | 1/2011 | Poulin et al. | |
| 2005/0034485 A1 | 2/2005 | Klefstad-Sillonville et al. | |
| 2006/0175581 A1 | 8/2006 | Douglas ............. | A41D 31/0066 252/500 |
| 2006/0252999 A1 | 11/2006 | Devaul et al. | |
| 2006/0282021 A1 | 12/2006 | Devaul et al. | |
| 2007/0049842 A1 | 3/2007 | Hill et al. | |
| 2007/0120297 A1 | 5/2007 | Weider | |
| 2008/0083740 A1 | 4/2008 | Kaiserman ............... | A43B 7/04 219/520 |
| 2008/0139911 A1 | 6/2008 | Chandrasekaran et al. | |
| 2008/0287769 A1 | 11/2008 | Kurzweil et al. | |
| 2009/0024017 A1 | 1/2009 | Ruffini et al. | |
| 2009/0088652 A1 | 4/2009 | Tremblay | |
| 2009/0306485 A1 | 12/2009 | Bell | |
| 2010/0068461 A1* | 3/2010 | Wallace .............. | B81C 1/00111 428/156 |
| 2010/0185398 A1 | 7/2010 | Berns et al. | |
| 2010/0198038 A1 | 8/2010 | Nagata ................ | A61B 5/04085 600/372 |
| 2010/0273049 A1 | 10/2010 | Vidal et al. | |
| 2010/0274100 A1 | 10/2010 | Bahar et al. | |
| 2011/0004088 A1 | 1/2011 | Grossman | |
| 2011/0260115 A1 | 10/2011 | Kim ............... | 252/503 |
| 2013/0281795 A1 | 10/2013 | Varadan | |
| 2013/0281815 A1 | 10/2013 | Varadan | |
| 2016/0222539 A1 | 8/2016 | Varadan et al. | |
| 2017/0354372 A1* | 12/2017 | Varadan ............. | A61B 5/04085 |

OTHER PUBLICATIONS

May 6, 2015 Office Action issued in the U.S. Appl. No. 13/829,898.
Uberoi, et al., Interpretation of the Electrocardiogram of Young Athletes, Circulation, 124: 746-757 (2011).
Nov. 13, 2014 Office Action issued in U.S. Appl. No. 13/829,898.
American Heart Association, "Heart Rate Variability: Standards of Measurement, Physiological Interpretation, and Clinical Use" Circulation. 1996; 93: 1043-1065.
Dekker et al., "Heart Rate Variability from Short Electrocardiographic Recordings predicts Mortality from All Causes in Middle-Aged and Elderly Men" American Journal of Epidemiology, vol. 145, No. 10, 1997, 899-908, http:aje.oxfordjournals.org/accessed on Oct. 25, 2012.
Huei et al., "Develop an efficient Electrode to detect ECG signal" download from the internet prior to Aug. 19, 2011.
Hulley et al., "Randomized Trial of Estrogen Plus Progestin for Secondary Prevention of Coronary Heart Disease in Postmenopausal Women" Estrogen Plus Progestin and CHD, JAMA Aug. 19, 1998—vol. 280, No. 7 (9 pages).
Indiareport, "Now a vest that tracks medical condition" dated Oct. 12, 2011, http://www.indiareport.com/news-details/print_news.php?id=11 . . . accessed Oct. 13, 2011 (1 page).
Jahrsdoerfer et al., "Clinical Usefulness of the EASI 12-Lead Continuous Electrocardiographic Monitoring System" CritCare Nurse 2005; 25:28-37, cnn.aacnjournals.org, accessed on Oct. 25, 2012.
Kleber, "ST-segment elevation in the electrocardiogram: a sign of myocardialischemia" Cardiovascular Research 45 (2000) 111-118.
Leicht et al., "Heart rate variability and endogenous sex hormones during the menstrual cycle in young women" Experimental Physiology, Manuscript received Nov. 28, 2002, ep.physoc.org, accessed Oct. 25, 2012 (6 pages).
Leonarduzzi et al., "Wavelet Leader Based Multifractal Analysis of heart Rate Variability during Myocardial Ischemia" 32nd Annual International Conference of the IEEE EMBS Buenos Aires, Argentina, Aug. 31-Sep. 4, 2010 (4 pages).
Llyod-Jones et al., "Heart Disease and Stroke Statistics 2010 Update, a Report from the American Heart Association" Circulation, http//circ.ahajournals.org/accessed on Oct. 25, 2012.
Narayan., "T-Wave Alternans and the Susceptibility to Ventricular Arrhythmias" Journal of the American College of Cardiology , vol. 47, No. 2, 2006, 269-281.
Nussmeier "The female perspective: Gender in cardiothoracic surgery" The Journal of Thoracic and Cardiovascular Surgery, Sep. 2003, 126: 618-9.
Pan et al., "A Real-Time QRS Detection Algorithm" IEEE Transactions on Biomedical Engineering, 328.
Rudinac et al., "Fractal and Multifractal Analysis of heart Rate Variability " Telsiks, Sep. 26-28, 2007, 325-328.
Scanlon, "Acoustic Sensor Pad for Physiology Monitoring" Proceedings—19th International Conference—IEEE/EMBS Oct. 30-Nov. 2, 1997 (4 pages).
Tabibiazar et al., "Silent Ischemia in People with Diabetes: A Condition That Must Be Heard" Clincal Diabetes, vol. 21, No. 1, 2003 (5pages).
Varadan et al. "e-bra with Nanosensors for Real Time Cardiac Health Monitoring and Smartphone Communication" journal of Nanotechnology in Engineering and Medicine, May 1, 2011, vol. 2 (7 pages).
Varadan et al. "e-Nanoflex Sensor System: Smartphone-Based Roaming Health Monitor" Journal of Nanotechnology in Engineering and Medicine Feb. 1, 2010, vol. 2 (11 pages).
Varadan, "Wireless Point-of-Care Diagnosis for Sleep Disorder With Dry Nanowire Electrodes" Journal of Nanotechnology in Engineering and Medicine Aug. 2010, vol. 1 (11 pages).
Varadan, "Am EKG in your Underwear. Nanostructured sensors, smartphones, and cloud computing promise a new platform everyday medical morning." Mechanical Engineering Magazine, http://memagazine.asme.org/Articles/2011/October/EKG_Underwear.cfm? PrintPage=yes, accessed Oct. 14, 2011 (5pages).

(56) References Cited

OTHER PUBLICATIONS

Zhang et al. "Pulse Transit-Time based Blood pressure Estimation Using Hilbert-Huang Transform" 31st Annual International Conference of the IEEE EMBS Minneapolis, Minnesota, USA, Sep. 2-6, 2009 (4pages).
Vijay K. Varadan; Prashanth S. Kumar; Sechang Oh; Gyanesh N. Mathur; Pratyush Rai; Lauren Kegley; E-bra with nanosensors, smart electronics and smart phone communication network for heart rate monitoring. Proc. SPIE 7980, Nanosensors Biosensors, and Info-Tech Sensors and Systems 2011, 79800S (Apr. 13, 2011); doi:10.1117/12.885649.
Growth of highly oriented carbon nanotubes by plasma-enhanced hot filament chemical vapor deposition Huang, Z. P. and Xu, J. W. and Ren, Z.F. and Wang, J. H. and Seigal, M. P. and Provencio, P. N., Applied Physics Letters, 73, 3845-3847 (1998), DOI:http://dx.doi.org/10.1063/1. 122912.
Bordjiba, Mohamed Mohamedi1 and Le H Dao. Binderless carbon nanotube/carbon fibre composites for electrochemical micropower sources. nanotechnology, vol. 18, No. 3 Published Jan. 3, 2007.
Jun. 10, 2015 Office Action issued in U.S. Appl. No. 13/449,755.
Kong et al., "Spontaneous Polarization-Induced Nanohelixes, Nanosprings, and Nanorings of Peizoelectric Nanobelts" Nano Lett. vol. 3, 12 1625-1631 (2003).
Nov. 13, 2014 Office Action issued in U.S. Appl. No. 13/449,755.
Zhou, Zhengping and Wu, Xiang-Fa and Fong, Hao. Electrospun carbon nanofibers surface-grafted with vapor-grown carbon nanotubes as hierarchical electrodes for supercapacitors, Applied Physics Letters, 100, 023115 (2012).
U.S. Appl. No. 13/499,755 dated Feb. 6, 2014 (3 pages).
U.S. Appl. No. 13/449,755 dated Jul. 2, 2014 (18 pages).
Pan et al., "A Real-Time QRS Detection Algorithm" IEEE Transactions on Biomedical Engineering, vol. BME-32. No. 3 Mar. 1985, 230-236.
U.S. Appl. No. 13/449,755 dated Jul. 3, 2013 (19 pages).
Yan et al. (Helical Polyaniline Nanofibers Induced by Chiral Dopants by a Polymerization Process. Advanced Mateirals. 2007, 19, 3353-3357).
Kim et al. (Fabrication of carbon nanofiber, Cu Composite powder by electroless plating and microstructural evolution during thermal exposure, Scripta Materialia, vol. 52, Issue 10, May 2005, pp. 1045-1049).
Park et al. (Growth and high current field emission of carbon nanofiber films with electroplated Ni catalyst, Diamond and Related Materials, vol. 14, issues 11-12, Nov.-Dec. 2005, pp. 2094-2098).
McGary et al. (Magnetic nanowires for acoustic sensors, J. Appl. Phys. 99, 088310 (2006).
United Sates Patent and Trademark Office Final Rejection for U.S. Appl. No. 13/499,755 dated Dec. 27, 2013 (18 pages).

\* cited by examiner

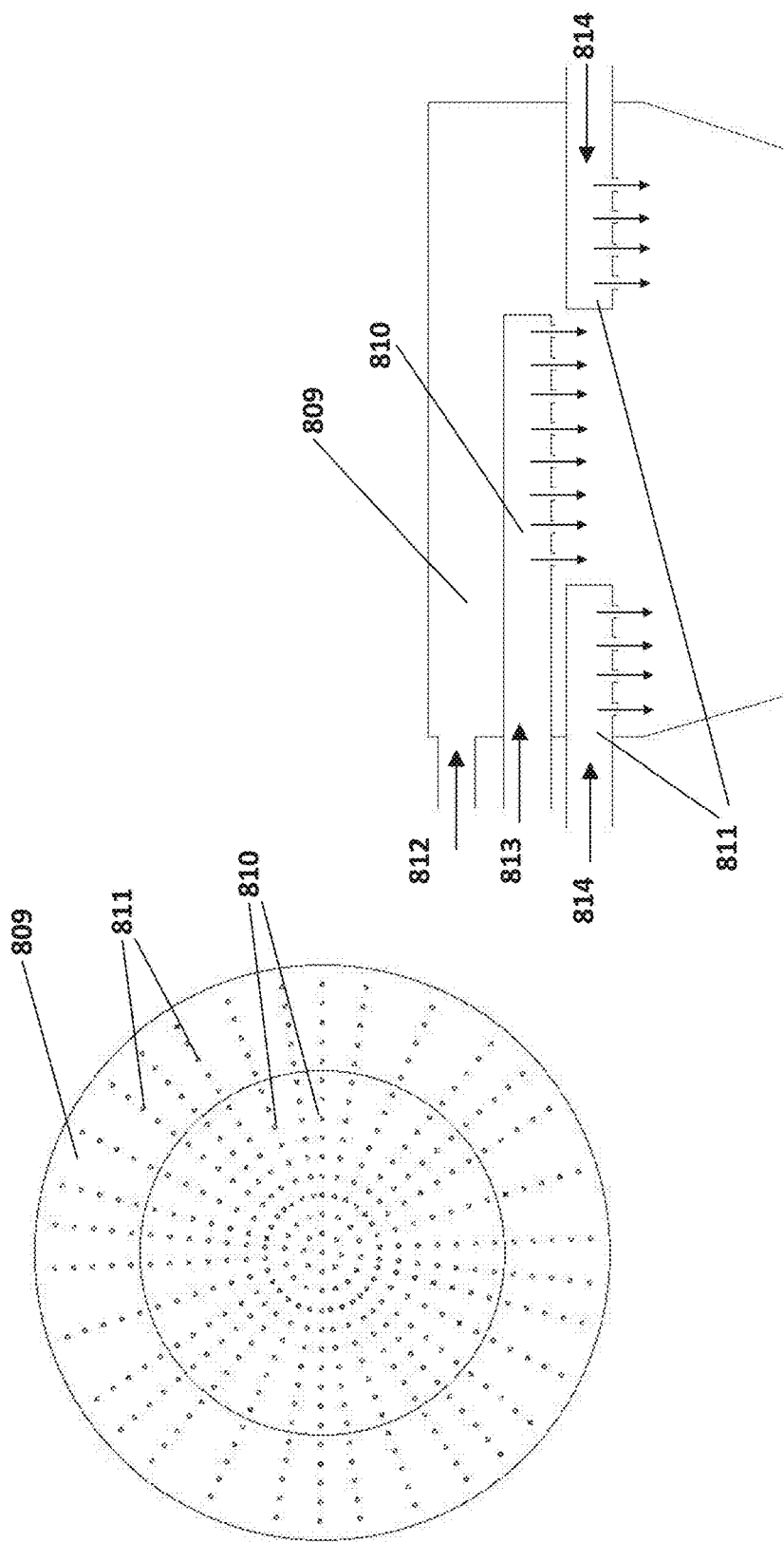

LARGE SCALE MANUFACTURING OF HYBRID NANOSTRUCTURED TEXTILE SENSORS

The present application claims priority to U.S. Ser. No. 62/291,088 filed Feb. 4, 2016, U.S. Ser. No. 14/995,334, filed Jan. 14, 2016, and U.S. Ser. No. 62/104,686, filed Jan. 16, 2015, the entire disclosures of which are hereby incorporated by reference.

The present disclosure relates generally to large scale manufacturing of textile sensors and specifically to hybrid nanostructured textile sensors.

BACKGROUND

Unobtrusive health monitoring is highly beneficial for maintaining health and independence of high risk and chronic disease patients. Intelligent wearable sensor systems with simple installation, minimal maintenance and user involvement can be the best method for ubiquitous health monitoring.

Wearable sensor systems in form of smart clothing can contribute tremendously to self-defined and autonomous (at home) living with improved quality of life. They are cost effective and provide lightweight simple technical infrastructure. Existing ambulatory recording equipment rely on conventional silver-silver chloride (Ag—AgCl) gel electrodes to perform long term monitoring. Such gel based electrodes cannot be adapted to clothing as re-usable sensors. Plane conductive textile based electrodes do not form a good quality contact and are susceptible to ambient noise such as 50/60 Hz.

The nanomaterials such as gold nanowires or carbon nanotubes rely on low through-put cleanroom fabrication technology or high temperature sintering process and electrospun nano-fibers. These materials are not compatible to large scale textile manufacturing. Further, gold nanowires and carbon nanotubes cannot withstand the abrasive force encountered in a typical wearable application and tend to collapse.

SUMMARY OF THE INVENTION

A method for large scale manufacturing of hybrid nanostructured textile sensors is provided in accordance with an embodiment of the present invention. The method includes the steps of embedding polymer nanofibers into a matrix polymer to form a yarn; dissolving the matrix polymer to expose the polymer nanofibers; and coating the polymer nanofibers in a film. The yarn can be a micro denier yarn. The micro denier yarn can have a helical structure. The method can further include a step of imparting an electrostatic charge to the yarn. prior to dissolving the matrix polymer. The polymer nanofibers can be made of a polymer material selected from the group consisting of polyethylene terephthalate, polyethylene naphthalate or polybutylene terephthalate. The polymer nanofibers can be made of a polyester. The polymer nanofibers can be made of a polyurethane. The matrix polymer can be made of a material selected from the group consisting of polystyrene, polyvinyl alcohol, ethylene vinyl alcohol, polyacrylamide or poly lactic acid. The matrix polymer can be made of a polyethylene terephthalate modified with sulfonated isocyanate. The film can be a conductive material selected from the group consisting of silver, gold, platinum, poly aniline, polypyrole, poly(3,4-ethylenedioxythiophene). The film can be a metal oxide film. The film can be a piezoelectric material film.

In accordance with another embodiment of the present invention. A method for manufacturing of hybrid nanostructured textile sensors comprising: feeding one or more polymers and a matrix polymer in molten form through respective extruders to a spinneret to produce fibers having filaments of the one or more polymers in the matrix polymer, the filaments having dimensions of from about 10 to about 100 nanometers; cutting the fibers to a length of from about 0.1 to about 1.5 mm to produce nanofibers;activating the cut nanofibers in a reactor; drying the activated nanofibers; applying an adhesive to a conductive fabric; depositing the activated nanofibers as vertically standing nanofibers, the depositing step including performing an electrostatic and/or pneumatic assisted deposition process using a. high strength electrostatic field of 2 kV/cm-10 kV/cm to electrostatically charge the activated nanofibers and deposit the electrostatically charged activated nanofibers as vertically standing nanofibers; curing the conductive fabric containing the vertically standing nanofibers; and electroless plating the vertically standing nanofibers, the electroless plating including dissolving the matrix polymer on the nanofiber surface to expose embedded nanostructures on the filaments, coating the nanofiber surface with a conductive material, and drying the conductive material to form a conductive film on the nanofibers, and annealing the conductive film coated nanofibers.

A nanostructured textile sensor is also provided. The nanostructured textile sensor includes freestanding nanofibers, the freestanding nanofibers being coated with a film. The film may be a metal oxide film. The film may be a piezoelectric material film. The film may also be a conductive material selected from the group consisting of silver, gold, platinum, polyaniline polypyrrole, poly(3,4-ethylenedioxythiophene).

BRIEF DESCRIPTION OF THE DRAWINGS

Various embodiments are disclosed, by way of example only, with reference to the accompanying schematic drawings in which.

DETAILED DESCRIPTION

The present disclosure provides a novel textile based nanostructured sensors that can be fabricated by using specially designed high throughput processes that are compatible with existing textile manufacturing technology.

Nanostructured textile-based dry sensors and electrodes are better suited for long term monitoring and measurement of biopotential signals such as electrocardiography (ECG or EKG), electroencephalography (EEG), electrooculography (EOG), electromyography (EMG) and bioimpedance with very low baseline noise, because of their improved sensitivity and ability to perform adequately with the natural moisture level of skin. Such textile based electrodes can be seamlessly integrated into garments of daily use such as vests, brassieres, bed sheets, wrist band, head band, chest band, arm band, gloves, and socks. In combination with state of the art embedded wireless network devices that can communicate with smart phone, laptop or directly to a remote server through the mobile network (GSM, 4G LTE, GPRS), they can function as wireless nanosensor systems that are more intuitive to use.

Figure 1:
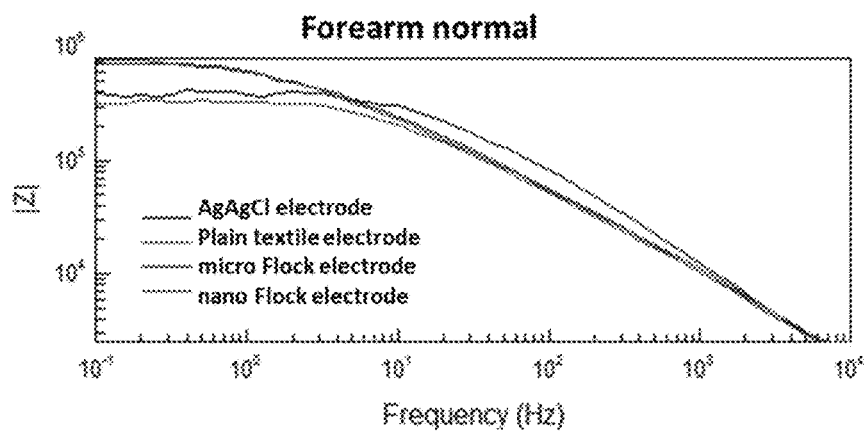
FIG. 1 shows a chart of the impedance of a normal forearm.

Nanostructured textile based sensors have large sensor surface area, which results in low skin-electrode contact resistance. Thus, it helps in increasing the sensitivity of sensor electrodes. This has been shown through impedance analysis of nanostructured textile electrode in comparison with plain textile electrode and silver-silver chloride electrode as shown in FIG. 1. FIG. 1 includes a Comparison of impedance spectroscopy on plane textile electrode, microstructured electrode and nanostructured electrode with Ag/AgCl gel electrode as standard. The testing was performed on forearm of young adult.

Figure 2:
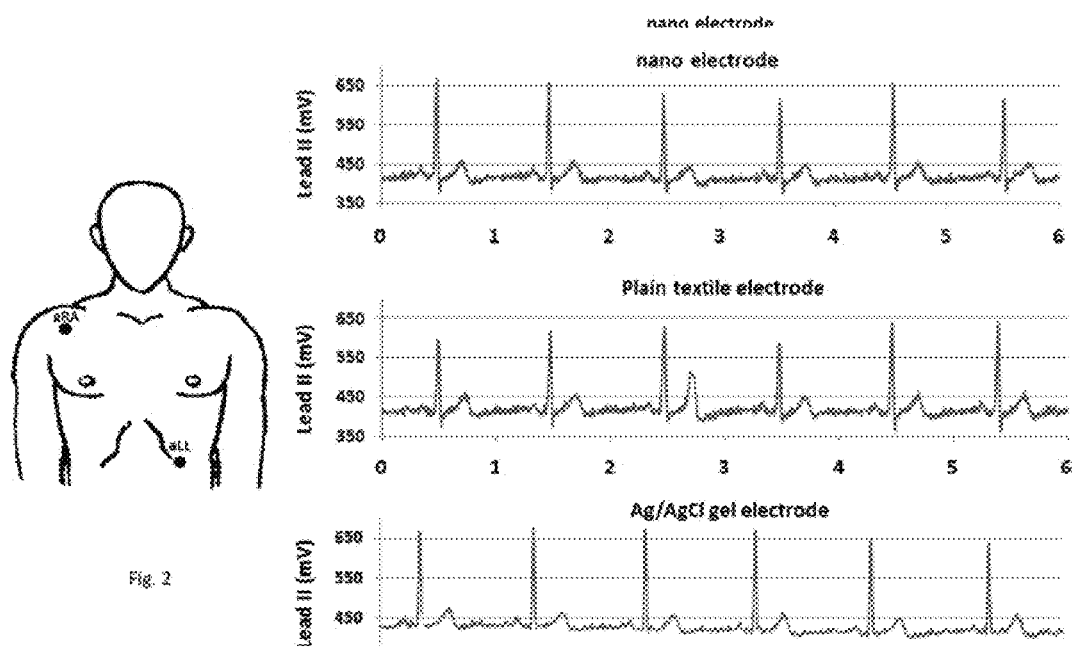
FIG. 2 shows charts of ECG signals from electrodes placed on a patient's chest.

As shown in FIG. 1, a nanosensor pair can be used to measure differential biopotential across the source organ. In case of ECG the signal source is the heart. So a differential potential measurement between the augmented. Right Arm (aRA) and augment Left Leg (aLL) results in Lead II ECG signal as shown in FIG. 2. The biopotential signal ECG Lead II from textile electrodes are shown in comparison with Lead II signal obtained from Ag/AgCl gel electrodes. Hence, nanosensors can be deployed in different configurations to acquire ECG signals along different axis of the cardiac plane.

Figure 3:
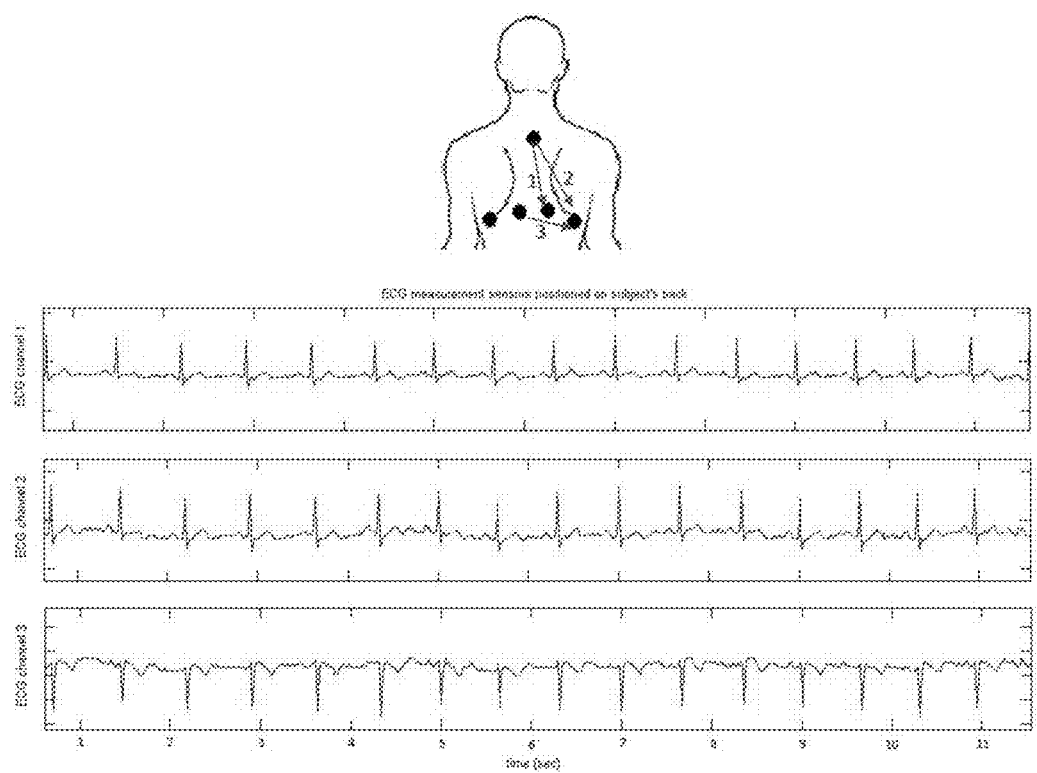
FIG. 3 shows charts of ECG signals from electrodes placed on a patient's back.

As an extension of the ECG measurement use case, nanosensors can be used to measure ECG from the back. The nanosensors can be deployed in various configurations for applications such as the bedsheets as well as car seats for monitoring biopotential signals. FIG. 3 shows the ECG signal from 3 different axes by placing the nanosensors on a subject's back as marked by the black dots.

Figure 4:
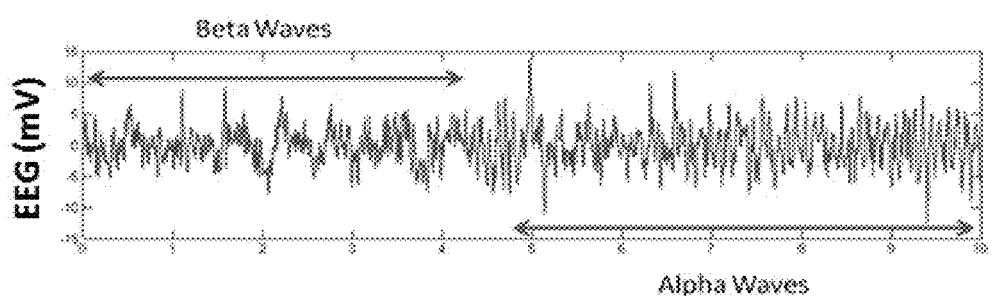
FIG. 4 shows a chart of EEG measurements.

Similarly, EEG signal can be obtained by placing a nanosensor on one of the defined EEG measurement positions e.g. occipital lobe position O1/O2 and the reference location at the mastoid bone. FIG. 4 shows an EEG signal showing Beta waves and onset of Alpha waves from a nanosensor at an occipital lobe position against a reference nanosensor located on the mastoid bone.

The main challenge is that nano-fibers by themselves cannot penetrate the meniscus of the adhesive on the substrate during a standard electrostatic deposition process (flocking). Also, such small structures are very difficult to handle during deposition and require a closed chamber or vacuum. To solve this problem, an innovative approach has been devised. Two/three component yarn, with polymer nanofibers embedded in a matrix of another polymer, can be used for textile fabrication followed by dissolving of the matrix polymer to expose the nanofibers. The fibers can be cut and flocked like normal micrometer scale (micro-denier) fibers and a subsequent dissolving step can release the nanofibers, resulting in vertically free standing nanostructures on the textile. Composite fibers are best suited because they can be flocked as micro-denier fibers and then bundled polymer nanofibers can be released by dissolving the matrix polymer.

Figure 5:
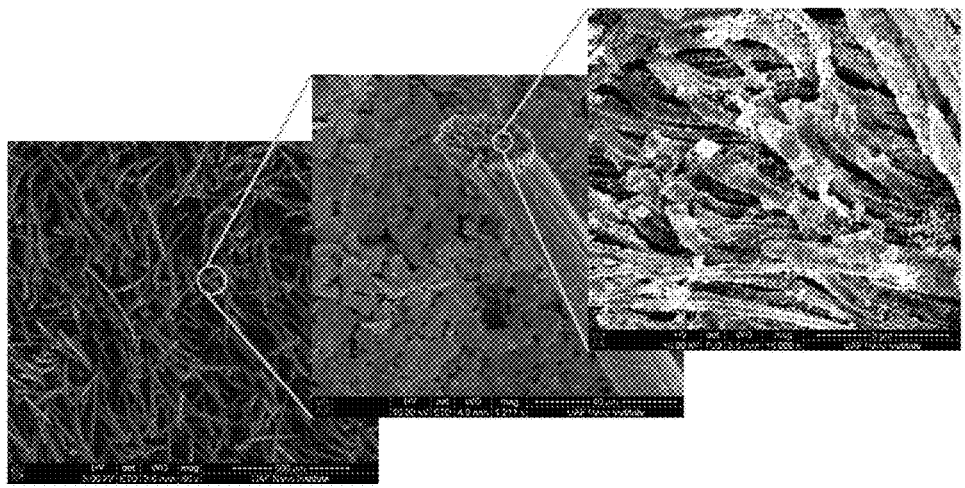
FIG. 5 shows cross-sectional views of polymer fibers distributed in a matrix of another polymer.

FIG. 5 shows a cross-section of hi-component fiber at 80×, 1211×, and 1500× magnification, where higher magnifications show the nanofibers exposed after dissolving the matrix polymer. FIG. 5 shows that 400 fibers of one polymer fibers are distributed in a matrix of another polymer. Given the micro-denier dimension of fibers, a bundle of as much as 1500 nanofilaments can be accommodated. Composite fibers are deposited as microfibers and then bundled polymer nanofibers can be released by dissolving the matrix polymer. This is followed by metallization of the structures with silver by an electroless plating method.

A three-dimensional helical structure 1 can be achieved by extrusion of composite fiber, where the constituent fibers shrink at different rates upon crystallization. The shrink rate is governed by variation in molecular cross-linking of the polymers.

The composite fibers can be cut in to small length of 500 μm to 1.5 mm using a cryo-blade, cooled down to −20° C. to −40° C. to get clean cut with no sticky ends.

Figure 6:
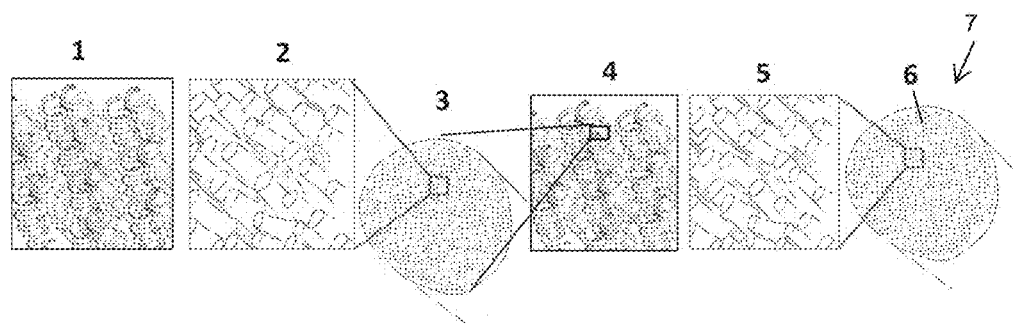
FIG. 6 shows plain views of textile based nanostructures including two component and three component nanostructured fibers.

FIG. 6 shows a composite fiber 7 which is formed from combination of two or three polymers, that are mutually immiscible, that can be drawn in to yarn by extrusion and cut into fibers so that a fractal architecture can be formed after dissolving the matrix polymer(s), which is one polymer forming long fibers (1 or 2) in a matrix of the other polymer 3 optionally forming long fiber bundles (4 or 5, respectively) in a matrix of a third polymer fiber 6. A cross-section of such a fiber shows that 60 to 1500 nanometer fibers of one polymer are distributed in matrix of the other polymer, thus giving the impression of islands in sea. FIG. 6 further shows that the combination of two or three polymers, that are mutually immiscible, can be drawn in to fibers by extrusion as fibers within fibers within fibers, A variant of this combination is shown in FIGS. 5 and 6. where the matrix polymer encompasses the inner fiber bundles and then extend further. Many such cut fibers can be deposited on the surface of a fabric to form free standing nanostructures.

The free standing nanostructured fibers can be coated with film of conductive material such as silver, gold, platinum, polyaniline, polypyrrole, poly(3,4-ethylenedioxythiophene) to make them electroactive for applications such as but not limited to health monitoring EKG, EEG, EOG, EMG electrode application, touch sensors. They can be coated with metal oxide such as films for capacitive sensing application such as but not limited to respiration rate, air quality, gas sensing, and water quality. They can be coated with piezoelectric material film like polyvinylidene difluoride (PVDF) for application such as but not limited to motion sensing, acoustic transduction, noise dampening, impact sensing.

Synthetic long chain polymers such as Polyester, Nylon, Polypropylene, Polybutylene, Polylactic acid, Poly-acrylonitrile. Polycarbonate, Polyurethane, Polyolefin, Polyimide and Polyaramid can be melt blown or solution blown, or extruded and spun into fibers on spinneret. Exemplary spinnerets are described, for example, in U.S. Pat. Nos. 4,406,850, 5,162,074, and 5,851,562, the entire disclosures of which is incorporated herein by reference. The extrusion template for drawing out the fibers can be modified to obtain fibers with diameter in the order of nanometers (10-2000 nm). These processes can obtain fibers that are only as wide as the single layer crystal made of polymer chains. The conventional synthetic polymer fiber spinning technology can be improved to produce composite fiber. Spinneret design can be modified to make groups of nanometer scale holes in nano or mesoscaled shafts distributed within the injection nozzle of micro-denier yarn. The diameter and length of nanometer holes and nano or mesoscaled shafts can be varied depending on the melting temperature, glass transition temperature and molecular weight of the component polymers. This is done to achieve well-defined fractal architecture of two/three polymer components in a micro-denier yarn.

For the two/three component yarn, a multicomponent extruder fed spinning unit can be used where two/three extruders feed the required two/three polymers in molten form to a spinneret with a special configuration to provide the filaments of one or more polymers of 10-100 nanometer dimensions in a matrix of the other polymer forming a micro denier yarn. The yarn can be multi polymer component bundles consisting up to 1000-1500 entities dispersed in the matrix. The nanometer scale filaments can be formed by polymers such as Polyesters such as Polyethylene terephthalate(PET), Polyethylene naphthalate(PEN), Polymethylene terephathalate(PMT), Polybutylene terephthalate(PBT), Polyurethanes both polyester and polyether based, Polyurethanes with interpenetrating polymeric network (IPN) and semi-IPN structure, Polyamides such as Nylon 6, Nylon 6,6, Nylon 6,10, Polyolefins such as Polyethylene and Polypropylene, Polycarbonates, Polyacrylonitrile, Styrene copolymers. The matrix can be formed by polymers such as Polyethylene terephthalate modified with Sulfonated isocyanate, Polystyrene, Polyvinyl alcohol, Ethylene vinyl alcohol, Polyacryl amide, Poly Lactic acid.

The embedded nanometer size filament bundles in the encompassing polymer matric of the micro denier fiber are normally straight linear filaments. However these linear filaments can be converted into helical structure by using polymer components such as Polyesters such as Polyethylene terephthalate (PET), Polyethylene naphthalate (PEN), Polymethylene terephathalate (PMT), Polybutylene terephthalate (PBT), Polyurethanes with IPN and semi-IPN structure, Polyamides such as Nylon 6, Nylon 6,6, Nylon 6,10, Styrene copolymers as bi- and tri- component interpenetrating polymeric network (IPN) which are initially in form of helices by controlling the molecularly bonded hard segments such as poly-isocyanate and soft segments such as polyether based polyol of the polyurethane filaments. They can be converted into linear filaments and nanobundles during melt extrusion, by thermal and mechanical stress, through the spinneret to make the two/three component yarn. Subsequently, the filaments can be converted back to helical form by a thermal stimulus as required by the IPN, which are either embedded in the micro denier yarn or released as free standing nanostructures after dissolving the matrix polymer. The spinneret and the cooling zone can be modified for this helix based two/three component yarn.

For an ECG monitoring electrode, metallization of the structures can be done with silver by electroless plating method. The surfaces of such sensor electrodes have nanoscale and mesoscale free standing conductive structures. This contributes to increasing the effective surface area of the electrodes and high aspect ratio nano/mesoscale structures can overcome the obstruction due to rough skin surface and body hair. A good skin-electrode interface with these nanostructured sensor electrodes is instrumental in detection of electrophysiological signals emanating from brain and heart to the skin surface.

The fibers can be chemically treated to impart electrostatic charge, a.k.a. activation. This can be done by treating the fibers with water soluble alum of ammonium and aluminum salts. This is done for electrostatic activation of the fibers. The fibers can be sifted to remove long fibers. Thus, prepared fibers can be applied to a fabric such that they are free standing because of mutual repulsion.

Figure 7A:
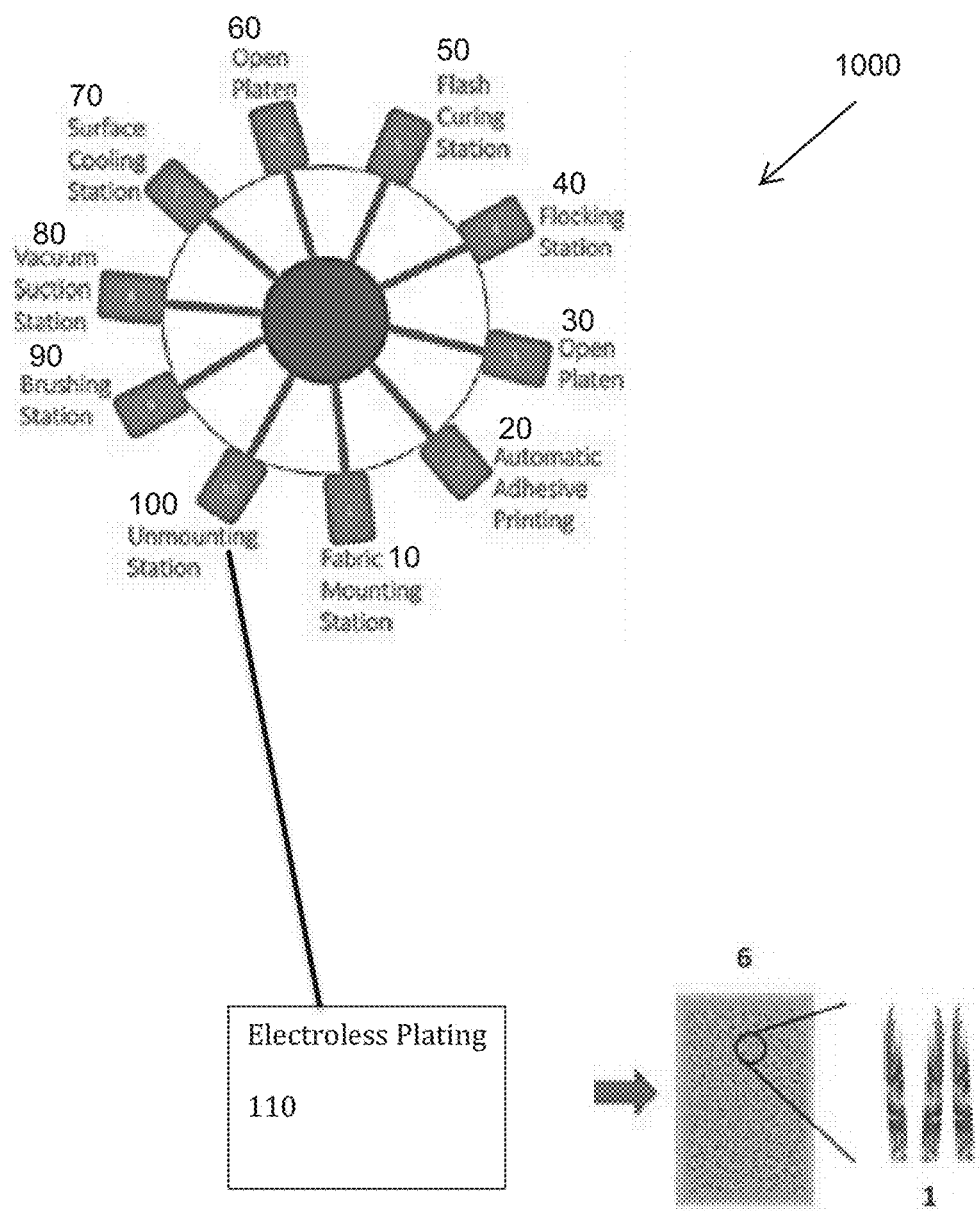
FIGS. 7(*a*) and (*b*) shows a diagram of a multi-stage printing machine.
Figure 7B:
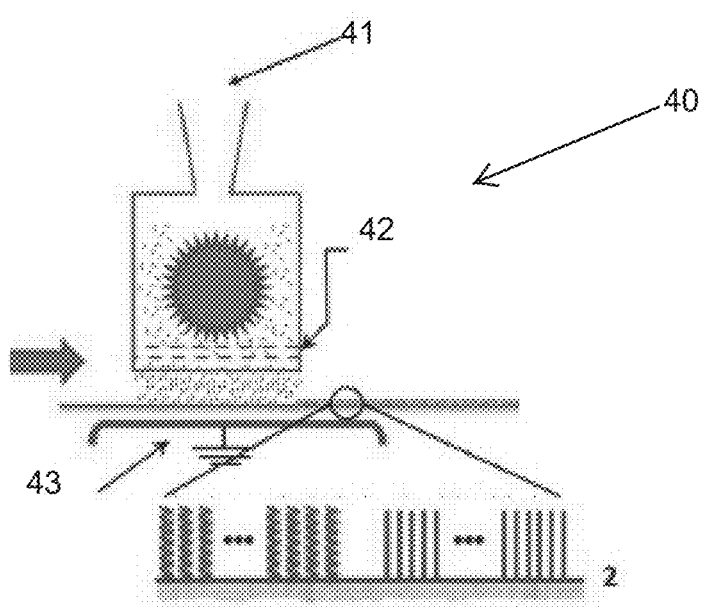

FIGS. 7(a) and 7(b) shows a multi-stage printing machine for an application of an adhesive on a textile substrate, deposition of nanostructured fibers under an electrostatic field or a pneumatic force and curing of an adhesive. An electrostatic and/or a pneumatic assisted deposition process uses a high strength electrostatic field of 2 kV/cm-10 kV/cm for deposition of electrostatically charged fibers. The fibers move at a high velocity under the influence of electric field applied perpendicular to the substrate (adhesive coated fabric, flexible plastic or a rigid substrate) and can attach vertically on it. After dissolving the matrix polymer this can result in vertically aligned microstructured or nanostructure arrays.

Electroless plating electrically functionalizes the nanostructures by enmeshing/decorating them with conformal conductive thin film of silver. The electroless plating process uses self-nucleation of the silver nanoparticles directly on the surface of the nanofibers.

FIG. 7(a) shows a top view of a circular printing press 1000 (for example, M&R Sportsman EX 8 station 6 Color-screen printing press). As illustrated, the press includes 10 stations or stages. The multiple stages involve—mounting the fabric in the press (Mounting Station 10), printing of adhesive film in a pattern of array of specific (sensor) shapes on conductive cloth substrate (mesh) fixed on a moving platform (platen) (Automatic Adhesive Printing Station 20), electrostatic force assisted deposition (for example, M&R Flocker 3000) of the nanostructured fibers driven towards the substrate by electrostatic field and attached to the adhesive layer in vertically upright position (Flocking Station 40), curing of the adhesive for complete attachment (Curing Station 50), cool down (Cooling Station 70), vacuum suction of unattached fibers (Vacuum Station 80) and brushing (Brushing Station 90), and finally removing the finished product from the press (Unmounting Station 100). Downstream of the unmounting station 100 is electroless plating system 110. Also illustrated are empty stations 30 and 60 (open platen or open moving platform) which can contain additional stations, but as illustrated simply expose the moving platform.

FIG. 7(b) illustrates the electrostatic force assisted deposition of the nanostructured fibers driven towards the substrate by electrostatic field and attached to the adhesive layer in vertically upright position performed by the Flocking Station 40 (for example, M&R Flocker 3000) in further detail. The flocking station 40 includes a pneumatic applicator 41 (such as a pneumatic cylinder), a positive electrode grid 41 and ground electrode 42 as is known in the art. This provides an electrostatic and pneumatic assisted deposition of electrostatically charged fibers with a high strength electrostatic field of, for example, 2 kV/cm-10 kV/cm as described above.

Figure 8:
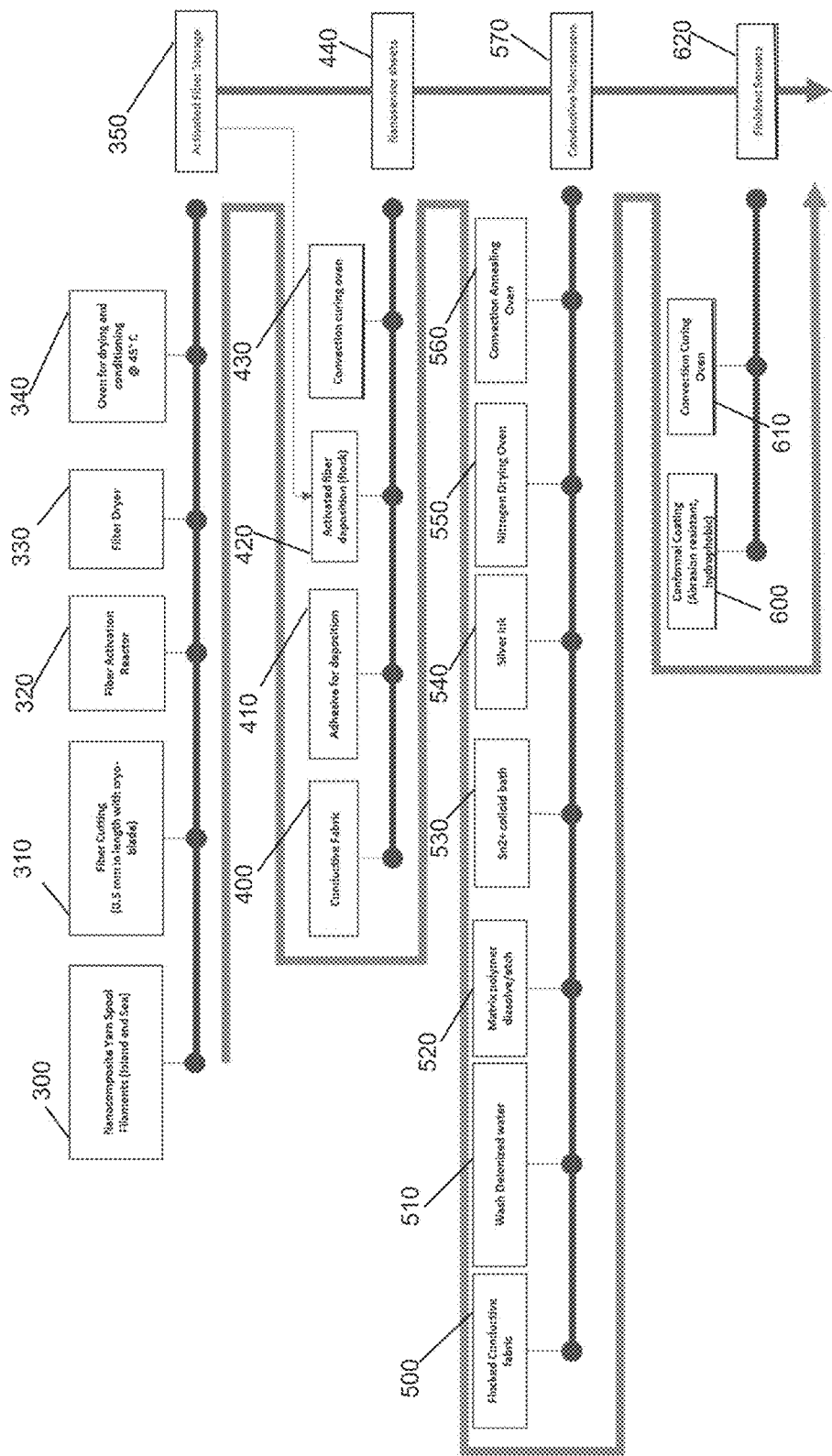
FIG. 8 shows a flowchart for a large scale manufacturing process of textile based nanosensors.

FIG. 8 shows a large-scale manufacturing process of textile based nanosensors for ECG monitoring systems. In step 300, nanocomposite yarn spool filaments are prepared. As described above, a two or three component (or more) yarn is prepared as a composite fiber 7. Two or three (or more) polymers in molten form are fed through respective extruders to a spinneret which is configured to have groups of nanometer scale holes in mesoscaled shafts with the injection nozzle. The spinneret provides filaments of one or more polymers of 10-100 nanometer dimensions in a matrix of the other polymer. In step 310, the fibers (7) produced by the spinneret are cut to a desired length by, for example, a cryoblade. The length of the cut fibers can be, for example, from 0.1 to 1.5 mm, and preferably about 0.5 mm. The cryoblade cools the composite fibers (7) to −20 to −40 C to get a clean cut with no sticky ends.

Figure 9A:
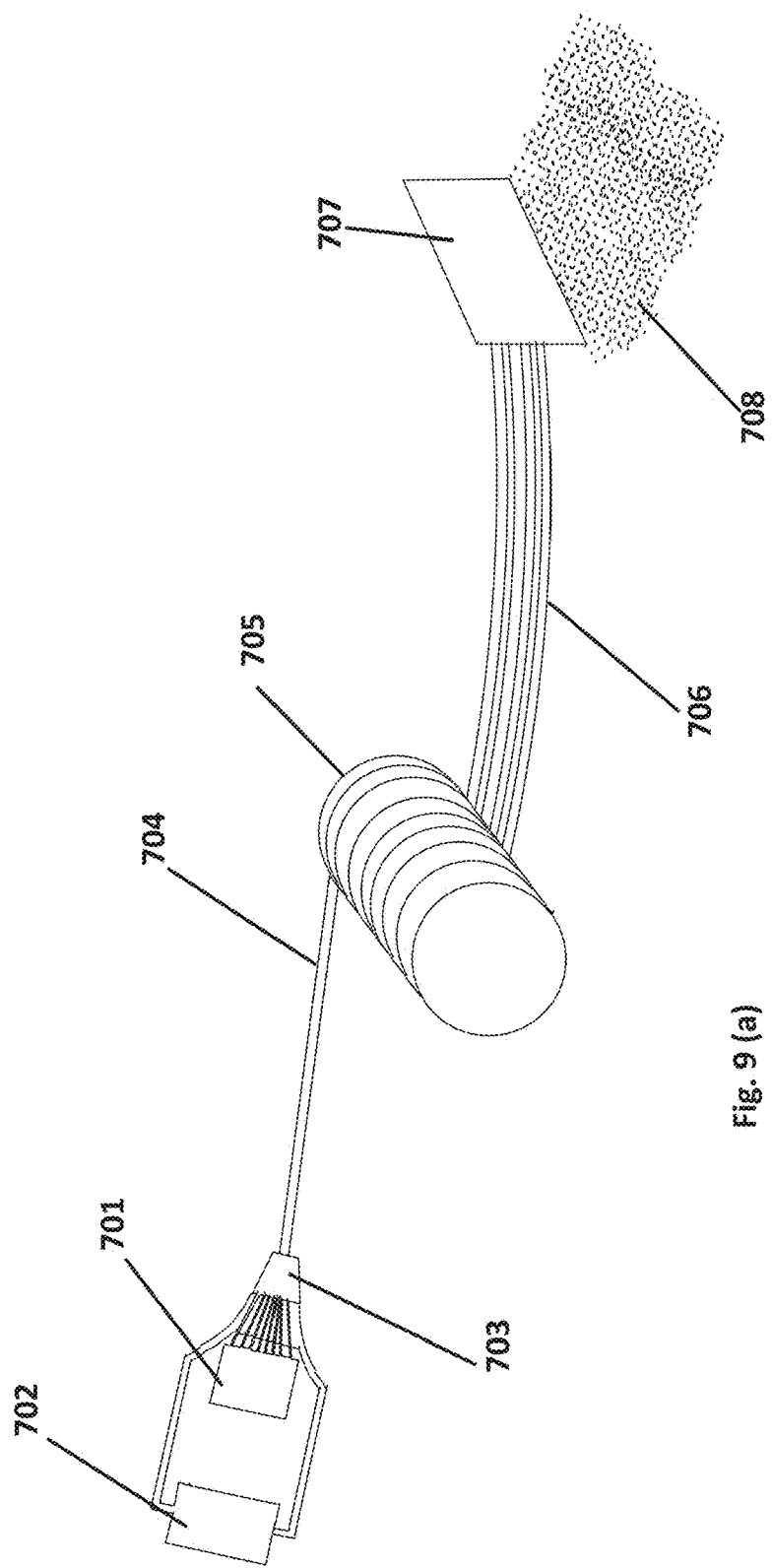
FIGS. 9(*a*) and (*b*) illustrate a process of forming two and three component nanostructured fibers respectively.
Figure 9B:
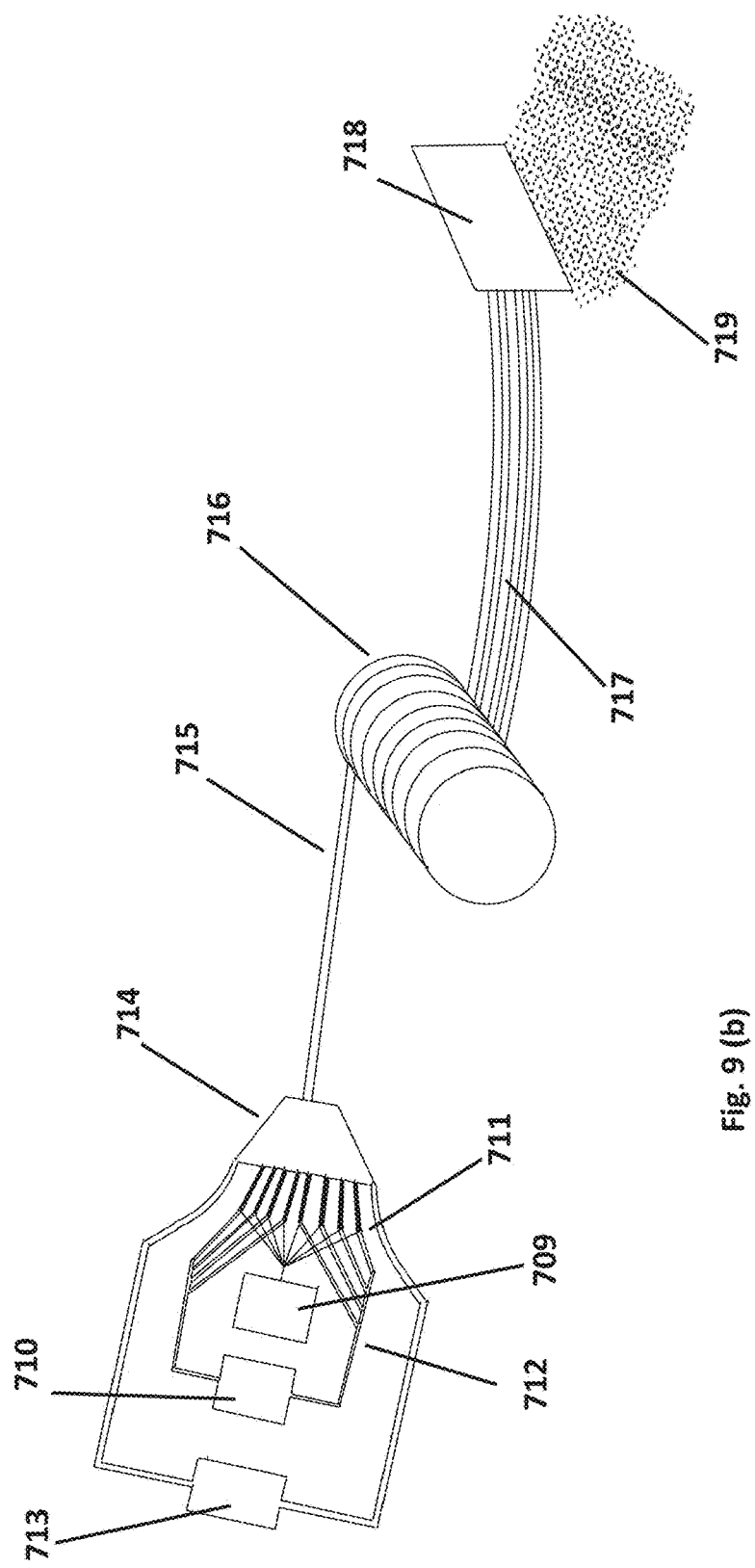
Figure 10A:
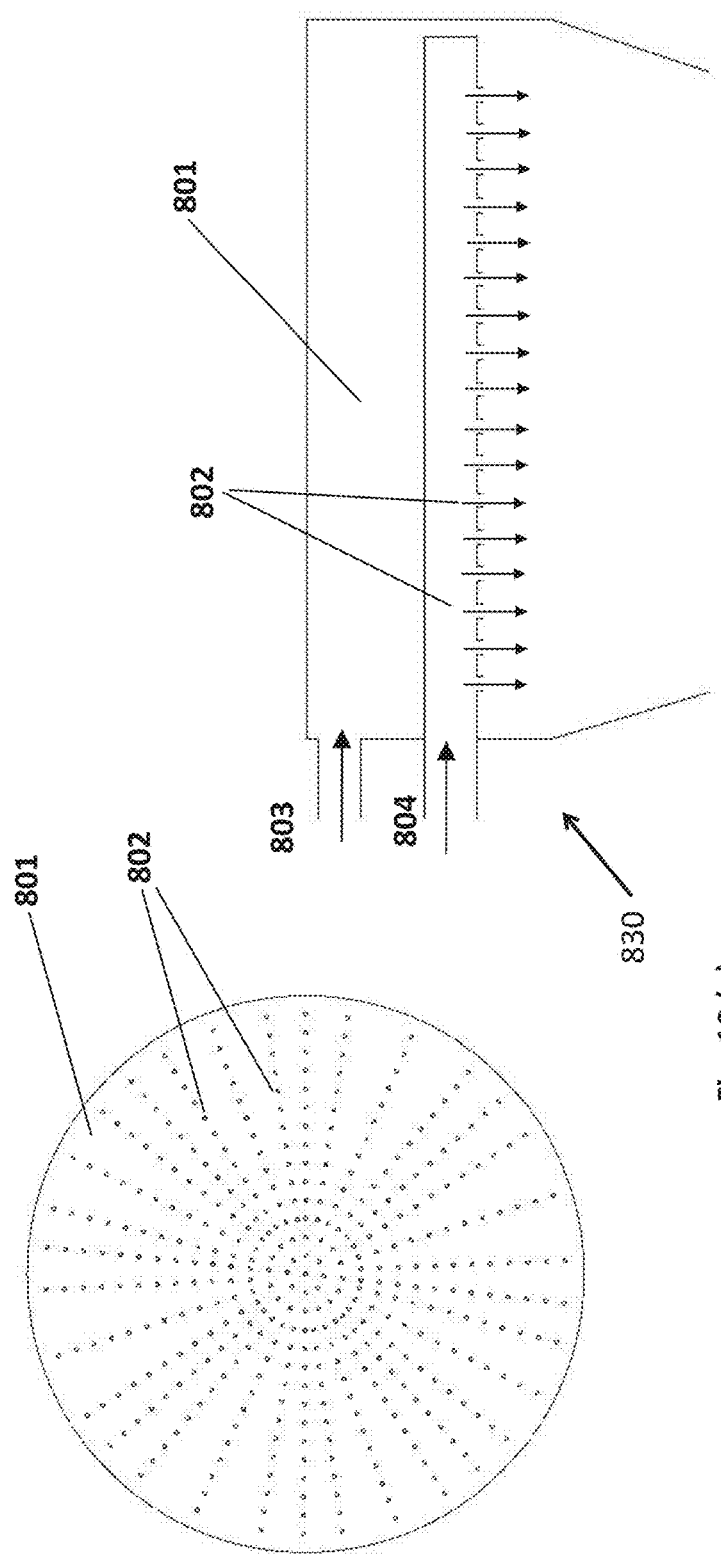
FIGS. 10(*a*) and 10(*f*) illustrate spinnerets for use in the processes of FIGS. 9(*a*) and 9(*b*).
Figure 10B:
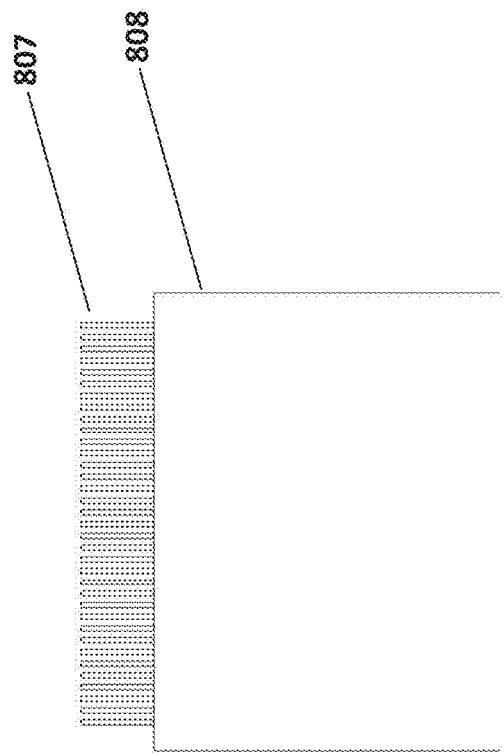
Figure 10B:
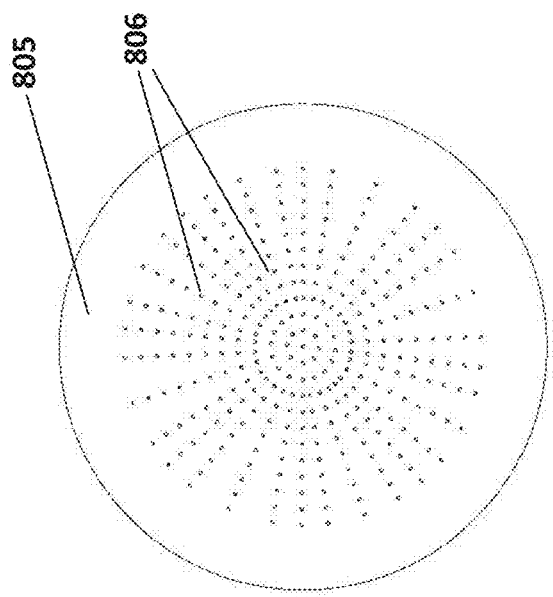
Figure 10D:
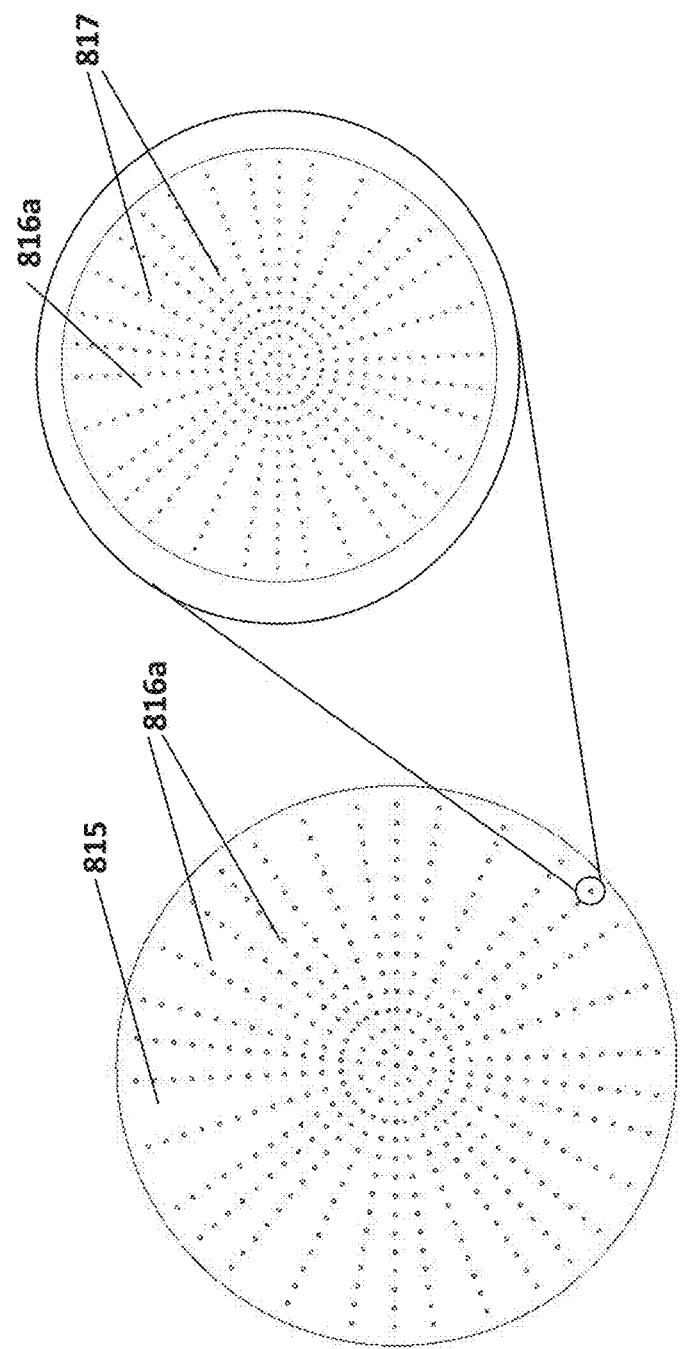
Figure 10E:
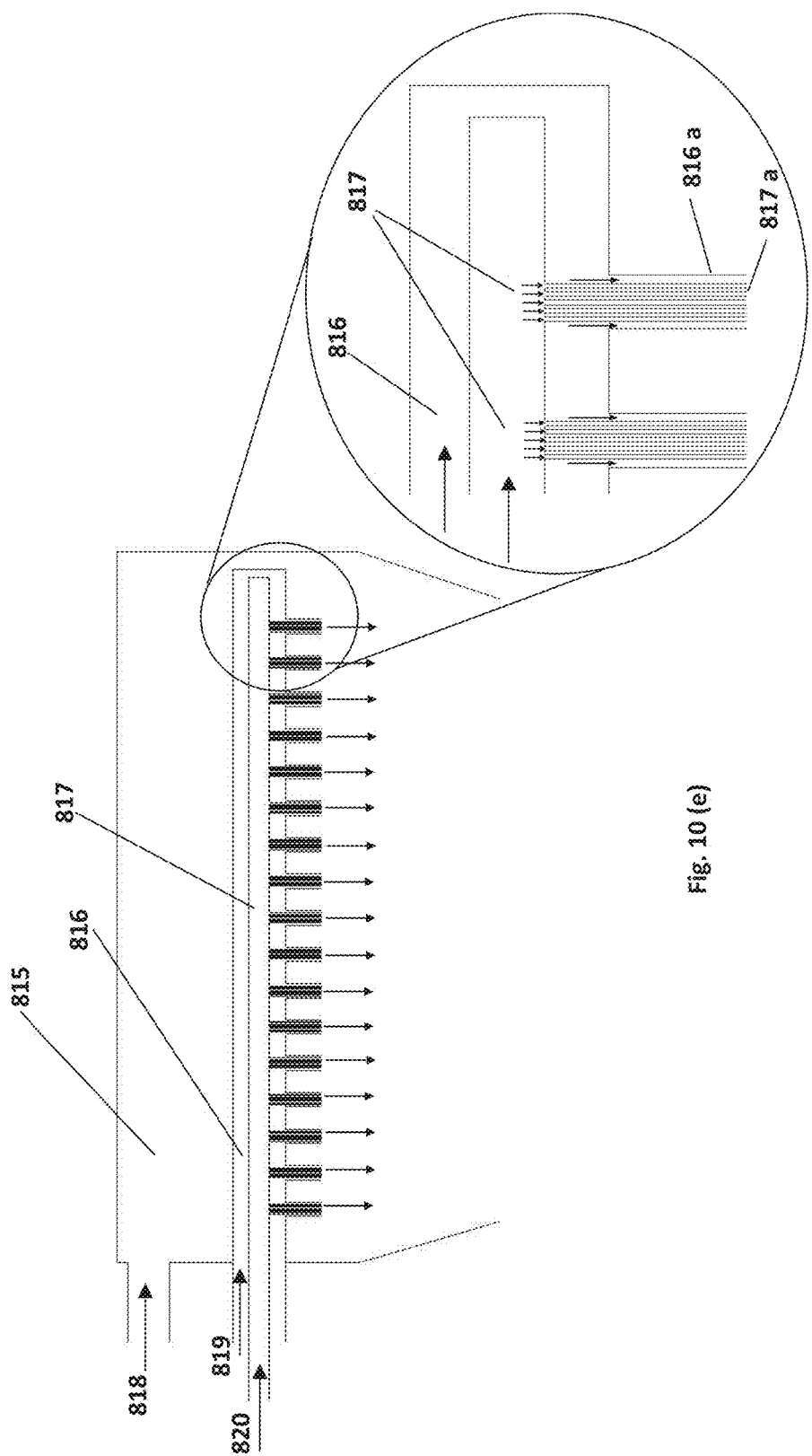
Figure 10F:
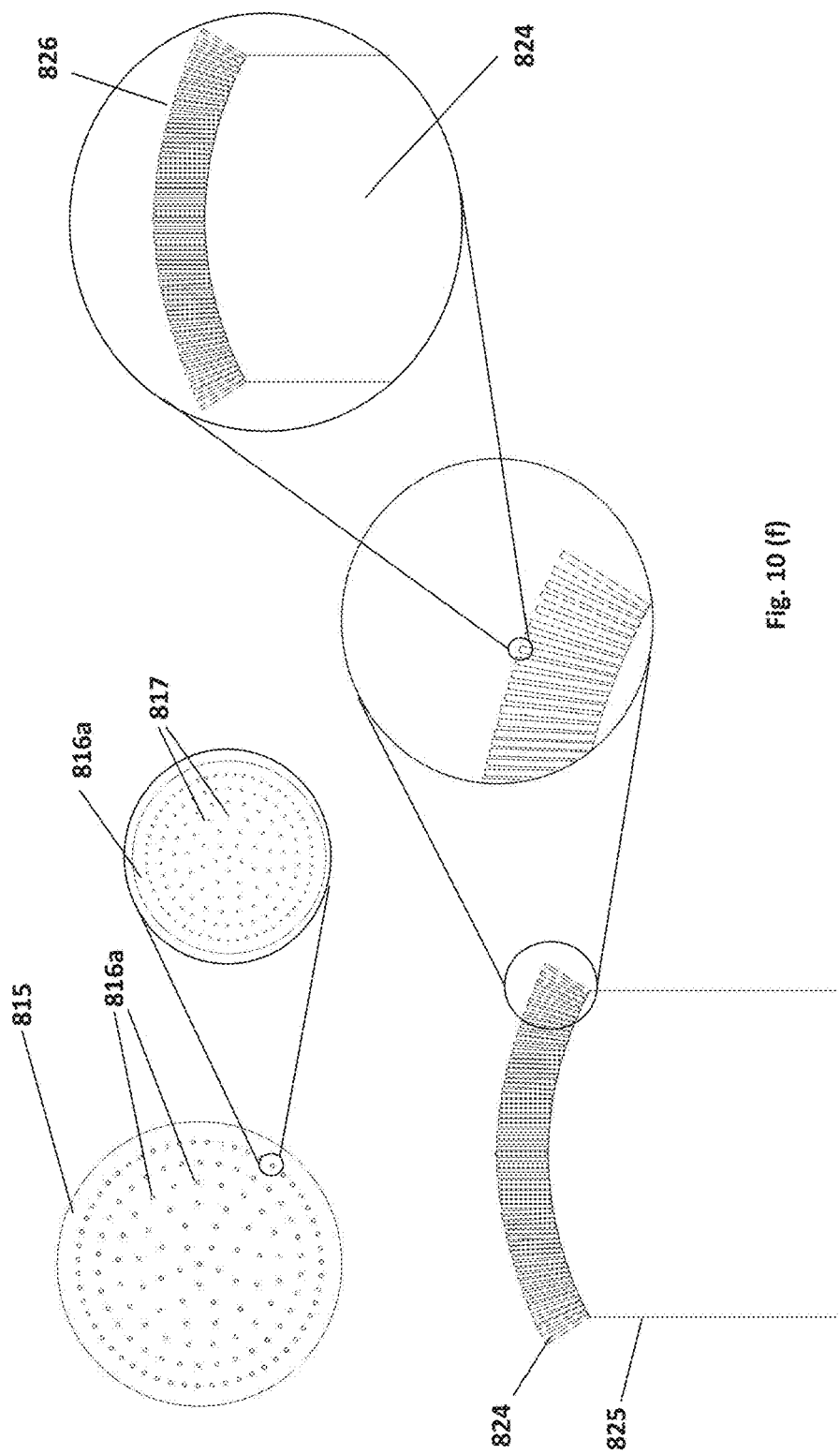

This is illustrated in FIGS. 9(*a*) and 9(*b*). FIG. 9(*a*) illustrates how composite fibers 708 are formed from a combination of two polymers 701, 702 that are mutually immiscible. FIG. 9(*b*) illustrates how composite fibers 719 are formed from a combination of three polymers 709, 710, and 713. In FIG. 9(*a*), the matrix polymer is polymer 701, and in FIG. 9(*b*) the matrix polymers are polymers 709 and 713. The polymers are combined via spinnerets 703, 714 into two or three component composite yarn 704, 715. The composite yarn 704, 715 is wound into a roll 705, 716. The yarn is later unrolled and cut into fibers 708, 719 by a cryoblade 707, 718.

Referring to FIG. 9(*a*), two polymers in molten form are fed through respective extruders. In particular, a first polymer 701 and a second polymer 702 are fed separately into a spinneret 703 in molten form to produce a composite yarn 704. The ratio of the polymers is dependent on the density of the nanofilaments within the fiber. For example, if there are 1500 filaments of 200 nanometer diameter each with in a fiber of 20 micrometer diameter, then the volumetric ratio would be about 1:5.7 (nanofilament polymer 701: matrix polymer 710). Exemplary ratios could, for example, be from about 1:3 to about 1:10, preferably from about 1:4 to about 1:6. Ratios in excess of about 1:10 are also possible.

The spinneret 703 is configured to have groups of nanometer scale holes in mesoscaled shafts with the injection nozzle. FIG. 10(*a*) illustrates the spinneret 703 in further detail, and in particular, the groups of nanometer scale (200 nm or less) holes in mesoscaled (30 microns or less) shaft(s) within the injection nozzle 830. The nanometer scale holes 802 are provided on surface of conduit(s) 802 (one of which is illustrated for ease of depiction) that run across the mesoscaled shaft 801. In this regard a single mesoscale shaft 801 typically has multiple conduits 802. One such mesoscaled shaft gives one microdenier fiber with multiple embedded nanofilaments, A spinneret can have a plurality of such mesoscale shafts. The polymer 702 is fed into inlet 803 of conduit 801 and the polymer 701 is fed into the inlet 804 of conduit 802. The spinneret 703 combines or draws mutually immiscible polymers 701, 702 into two component composite yarn 704. The composite yarn 704 is then wound into a roll. The yarn 704 is then bundled in the form of tow 706 and then cut into composite fibers 708 having a length of about 500 µm to about 1.5 mm by a cryoblade 707. The cryoblade 707 cools the yarn down to −20° C. to −40° C. before cutting to get clean cut with no sticky ends. The result is composite fibers 708 which are comprised of one polymer forming long fibers 701 in a matrix of the other polymer 702. A cross-section of such a fiber would, for example, show 60 to 1500 nanometer fibers of one polymer distributed in matrix of the other polymer, thus giving the impression of islands in sea.

Returning to spinneret 703, the arrangement of nanoscale holes can be designed to achieve different distributions of nanofilaments within the stock of the composite fiber 708. For example, as illustrated in FIG. 10(*b*), the nanoscale holes 806 (which, as described in connection with FIG. 10(*a*), are provided on the surface of conduits that run across the mesoscaled shaft) can be concentrated in the center of the mesoscaled shaft 805 leaving a region of matrix polymer at the boundaries. Upon deposition (for example, in flocking station 40) and matrix polymer dissolution of such fibers (for example, in electroless plating system 110), the nanofilaments 807 can be exposed only at the tip of the composite fiber 708 while leaving a portion of polymer matrix stock 808 intact.

Similarly, as illustrated in FIG. 10(*c*) nanometer scale holes 810 at the center of the mesoscaled shaft 809 can he fed with one molten polymer mix and the nanoscaled holes 811 at the boundary of the mesoscaled shaft 809 can be fed with another molten polymer mix. The spinneret design can be modified to provide separate conduits 810, 811 for each molten polymer within the mesoscale shaft 809. Inlet 812 is provided for mesoscaled shaft 809, inlet 813 is provides for conduit 810, and inlets 814 are provided for conduits 811. Upon deposition and matrix polymer dissolution of such fibers, the nanofilaments of different chemical and mechanical properties can be obtained depending on the application.

Referring to FIG. 9(*b*), three polymers in molten form are fed through respective extruders. In particular, a first polymer 709, a second polymer 710, and a third polymer 711 are separately fed into a spinneret 714 in molten form to produce a composite yarn 712. As compared with the two-polymer yarn of FIG. 9(*a*), the three-polymer yarn of FIG. 9(*b*) can be viewed as being comprised of the two-polymer yarn of FIG. 9(*a*) which is enveloped in a second matrix polymer 711. The ratio of the polymers is dependent on the density of the nanofilaments within the fiber. The ratio of could, for example, be from about 1:3 to about 1:10, preferably from about 1:4 to about 1:6 (polymer 710: polymer 713), and from about 1:2 to about 1:10, preferably from about 1:3 to about 1:5 (polymer 709: polymer 710). In both cases, ratios in excess of about 1:10 are also possible. The spinneret 714 is configured to have groups of nanometer scale holes in mesoscaled shafts with the injection nozzle.

The wound yarn 715 is then bundled in the form of tow 717 and then cut into composite fibers 719 having a length of about 500 µm to about 1.5 mm by a cryoblade 718. The cryoblade 718 cools the yarn down to −20° C. to −40° C. before cutting to get clean cut with no sticky ends.

The result is composite fibers 719 which are comprised of one polymer forming long fibers 709 in a matrix of the other polymer 710 which forms long fiber bundles 712 in a matrix of the third polymer fiber 713. A cross-section of such a fiber would, for example, show 10 to 100 nanometer fibers of one polymer 709 distributed in matrix of another polymer 710 which together form bundles 712 in matrix of the third polymer fiber 713, thus giving the impression of islands in sea. There may be 60 to 1500 of such bundles within polymer 713.

FIGS. 10(*d*) through 10(*f*) illustrates the spinneret 714 in further detail. For the tri-component yarn of FIG. 9(*b*), the above mentioned nanometer scale holes shown in FIG. 10(*a*) are implemented as conduits 816 with nanometer scaled shafts 816*a* projecting out of conduits 816. each conduit 816 having an inlet 819 as shown in FIG. 10(*d*)-(*e*). Smaller conduit(s) 817 each having an inlet 820 run within conduit 816. The conduit 817 has nanometer scaled tubes 817*a* projecting out of the conduit(s) 817 and into the nanometer scaled shafts(s) 816*a*. Also shown is mesoscaled shaft 815 with inlet 818.

FIG. 10(*f*) shows how the arrangement of FIG. 10(*d*) can be designed to achieve different distributions of nanofilaments within the stock of the composite fiber. For example, the nanometer shafts and tubes 816*a*-817 can be arranged in concentric ring patterns with the number of holes/tubes increasing in successive outer rings in specific progression such as but not limited to Fibonacci series. Upon deposition and matrix polymer dissolution of such fibers, the nanofilaments 824, 826 get exposed and project outward in a spreading pattern (FIG. 10 (*f*) thus providing more effective surface area for contact at the fiber tips 825 and nanofilament tips 826.

Fibers 708, 719, with fibers in a matrix of another fiber (FIG. 9*a*) or fibers in a matrix of another fiber which in turn is in a matrix of another fiber (FIG. 9*b*), provide for the formation of a fractal architecture after dissolving the matrix polymer(s) 702, 710, 713, which is one polymer forming long fibers (701 or 709) in a matrix of the other polymer 702, 710 optionally forming long fiber bundles 712 in a matrix of a third polymer fiber 713.

Referring again to FIG. 8, in step 320, the cut nanofibers 7 are activated in a. reactor, for example, in a stirred tank reactor such as a Columbia International's CIT-CR100GD-TC20). The reactor may be a glass vessel with stirring mechanism, temperature control, pH control, inlets and outlets for materials and solutions. The fiber activation is done in a temperature and pH controlled treatment (preferably at a temperature in a range from about 40 C to about 80 C, and at a pH in a range from about 4 to about 6) with water soluble alum of ammonium and aluminum salts. In step 330, after the fibers have been treated with water soluble alum of ammonium and aluminum salts, the mix is filtered to separate the fibers from the activation solution. These fibers are then put in a dryer to remove excess moisture using hot air convention oven at about 40-45 degree C. The dryer can, for example, be a convection oven or a tumble-drying oven. The fibers are then sifted to remove any large size fibers. The treated fibers are then again dried and conditioned at 45° C. in a convection oven with temperature control such as a VWR Gravity Convection oven in step 340. The activated fibers are then stored (step 350) for use in later steps. Preferably, the activated fibers are stored in sealed plastic bags under nitrogen at a temperature of about 22-25 degree C. Before the fiber are used in later processing, they are conditioned in an environment of about 25-35% relative humidity at room temperature (about 20 to 22° C.).

In step 400, a conductive fabric is provided, preferably as a sheet. For example, this can be performed at mounting station 10 of the press. In step 410, adhesive is applied to the conductive fabric, for example, at automatic adhesive printing station 20. The conductive fabric is moved from station to station on a moving platform driven by one or more motors of the press as is known in the art. In step 420, the activated fibers (from step 350) are applied to the adhesive coated conductive fabric in a deposition process (Activated fiber deposition (Flock) 420). Step 420 is preferably performed with stations 40 (flocking), 50 (flash curing), 70 (surface cooling), 80 (vacuum suction), and 90 (brushing) of FIG. 7(*a*). Deposition is performed with an electrostatic and/or pneumatic assisted deposition process using a high strength electrostatic field of 2 kV/cm-10 kV/cm for deposition of the electrostatically charged nanofibers as vertically standing nanofibers as described above. This can be performed, for example, with the flocking station 40. This is followed by flash curing at a temperature of from about 120 C to about 180 C (depending on the adhesive formulation used and the composition of the fiber) in flash curing station 50. The fabric with deposited vertically standing nanofibers is then cooled in surface cooling station 70, vacuumed to remove loose fibers and debris in vacuum suction station 80, and then brushed in brushing station 90 to further remove loose fibers and debris. Then, in step 430, after and the nanosensor sheets are removed from the press at unmounting station 100, the conductive fabric with vertically standing nanofibers is cured in a convection curing oven at about 120-180 C. At this point, nanosensor sheets have been produced (step 440).

The nanosensor sheets can be functionalized with conductive film with the help of electroless plating by enmeshing/decorating the nanostructures with conformal conductive thin film of silver described in steps 500-620 of FIG. 8. The electroplating process detailed in FIG. 8 is done by a modular electroless plating system 110 with multiple chemical tanks that perform chemical treatment of the previously made nanosensor sheets, which as described above include a nanostructured fiber array on the flexible substrate such as conductive cloth substrate/mesh or plastic, The tanks are glass lined and the dimensions are dependent on the size of conductive textile substrate being used for fabrication. The steps of chemical treatment include (i) a matrix polymer etch on the fiber surface to expose embedded nanostructures, (ii) cleaning the fiber surface, (iii) priming the fiber surface for plating with Sn2+ colloidal bath, (iv) dip coating of fiber surface with silver plating ink, (v) drying of the ink to form silver film on fibers in nitrogen environment in excess of 60° C., (vi) annealing of the silver film in excess of 100° C. to improve attachment, and (vii) conformal coating of the nanosensor surface with dielectric polymer film such as poly 4-vinyl phenol. Drying of the ink is done in a nitrogen oven with temperature and nitrogen flow control such as a Keen Ovens K-900, annealing is done in a convection oven with temperature control such as a VWR Gravity Convection oven, conformal coating is done with a 360° spray coating nozzle such as a BETE MicroWhirl nozzle, and curing of the film is done in a convection oven with temperature control such as a VWR Gravity Convection oven.

In particular, at step 500, the flocked conductive nanosensor sheets with vertically standing fibers are provided to the electroless plating system 110, This can be achieved either automatically, for example, with an automated conveyor, or manually, for example, by hand. In any event the sheets are washed in deionized water (step 510) and then subjected to chemical treatment.

In this regard, in step 520, a matrix polymer etch is performed on the nanofiber surface (which is the surface of the composite nanofibers 7 which have been cut, activated, and deposited) to dissolve the matrix polymer and expose embedded nanostructures. The matrix polymer can be dissolved by dipping the nanosensor sheet(s) in a solvent bath (which is, for example, a part of the modular electroless plating apparatus). The embedded nanofibers, by design/chemistry, are immiscible in the solvent. After dissolution of the matrix polymer, the embedded nanofibers are exposed. The nanofiber surface is then cleaned. Vertically free standing nanofibers on textile substrate are achieved in this manner to achieve a textile based nanosensor. These nanosensors are now ready for coating of conductive or any other functional film as described in this application.

Then, in step 530, the nanofiber surface is primed for plating with a Sn2+ colloidal bath. The nanofiber surface is then dip coated with silver plating ink in step 540, and then the ink is dried (step 550) to form silver film on nanofibers in nitrogen environment in excess of 60° C. Then, in step 560, the silver film is annealed at a temperature in excess of 100° C. to improve attachment to the nanofiber surface. At this point in the process, conductive nanosensors have been produced (step 570). Then, in step 600, conformal coating of the nanosensor surface is performed with dielectric polymer film such as poly 4-vinyl phenol. Conformal coating may, for example, be performed with a 360° spray coating nozzle such as a BETE MicroWhirl nozzle. Then, in step 610, the film is cured in a convection oven, for example, in a convection oven with temperature control such as a VWR Gravity Convection oven.

The process flow shown in FIG. 8 and detailed above describes the 4 stages of fabrication from nanostructured fiber activation to the final conformal coating with dielectric polymer film. The nanofiber activation process (Stage 1, steps 300-350) is carried out in stirred tank reactor such as a Columbia International's CIT-CR100GD-TC20). The reactor is a glass vessel with stirring mechanism, temperature control, pH control, inlets and outlets for materials and solutions. The nanofiber activation is done in a temperature and pH controlled treatment (preferably at a temperature in a range from about 40 C to about 80 C, and at a pH in a range from about 4 to about 6) with water soluble alum of ammonium and aluminum salts as described above. The treated nanofibers are dried and conditioned at 45° C. in a convection oven with temperature control such as a VWR Gravity Convection oven (step 340). The nanosensors are fabricated during the printing process (Stage 2, steps 400-440) and then electroless plated to get conductive nanosensors (Stage 3, steps 500-570). These nanosensors are then finished with conformal coat of dielectric polymer film (Stage 4, steps 600-620).

In the preceding specification the invention has been described with reference to specific exemplary embodiments and examples thereof. It will, however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A method for manufacturing of hybrid nanostructured textile sensors comprising:
    embedding polymer nanofibers into a matrix polymer to form a yarn;
    dissolving the matrix polymer to expose the polymer nanofibers; and
    coating the polymer nanofibers with a film.

2. The method as recited in claim 1 wherein the yarn is a micro denier yarn.

3. The method as recited in claim 1 wherein the micro denier yarn has a helical structure.

4. The method as recited in claim 1 wherein the polymer nanofibers are vertically standing structures.

5. The method as recited in claim 1 wherein the polymer nanofibers are helical structures.

6. The method as recited in claim 1 further comprising the step of:
    imparting an electrostatic charge to the yarn prior to the dissolving the matrix polymer.

7. The method as recited in claim 1 wherein the polymer nanofibers are made of a polymer material selected from the group consisting of polyethylene terephthalate, polyethylene naphthalate and polybutylene terephthalate.

8. The method as recited in claim 1 wherein the polymer nanofibers are made of a polyester.

9. The method as recited in claim 6 wherein the step of imparting further includes performing an electrostatic and/or pneumatic assisted deposition process using a high strength electrostatic field of 2 kV/cm-10 kV/cm.

10. The method as recited in claim 1 wherein the polymer nanofibers are made of a polyurethane.

11. The method as recited in claim 1 wherein the matrix polymer is made of a material selected from the group consisting of polystyrene, polyvinyl alcohol, ethylene vinyl alcohol, polyacrylamide and poly lactic acid.

12. The method as recited in claim 1 wherein the matrix polymer is made of a polyethylene terephthalate modified with sulfonated isocyanate.

13. Themethod as recited in claim 1 wherein the film is a conductive material selected from the group consisting of silver, gold, platinum, polyaniline, polypyrrole and poly(3, 4-ethylenedioxythiophene).

14. The method as recited in claim 1 wherein the film is a metal oxide film.

15. The method as recited in claim 1 wherein the film is a piezoelectric material film.

16. The method of claim 1, further comprising
    receiving a fabric piece in a printing press,
    printing an adhesive film in a pattern of array of specific shapes on the fabric; and
    electrostatic force assisted deposition of the film coated nano-fibers onto the adhesive film on the fabric in a vertically upright position.

* * * * *